(12) United States Patent
Nakayama et al.

(10) Patent No.: US 11,560,962 B2
(45) Date of Patent: Jan. 24, 2023

(54) VENTILATION COMPONENT

(71) Applicant: NITTO DENKO CORPORATION, Ibaraki (JP)

(72) Inventors: Yusuke Nakayama, Osaka (JP); Youzou Yano, Osaka (JP); Akira Miyagaki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 17/287,275

(22) PCT Filed: Oct. 17, 2019

(86) PCT No.: PCT/JP2019/040955
§ 371 (c)(1),
(2) Date: Apr. 21, 2021

(87) PCT Pub. No.: WO2020/085210
PCT Pub. Date: Apr. 30, 2020

(65) Prior Publication Data
US 2021/0396323 A1    Dec. 23, 2021

(30) Foreign Application Priority Data

Oct. 25, 2018 (JP) .............................. JP2018-201122

(51) Int. Cl.
*F16K 15/14* (2006.01)
*F16K 24/04* (2006.01)
(Continued)

(52) U.S. Cl.
CPC ............ *F16K 15/148* (2013.01); *F16K 24/04* (2013.01); *F16K 27/0209* (2013.01); *H01M 50/30* (2021.01); *H05K 5/06* (2013.01)

(58) Field of Classification Search
CPC .... F16K 15/148; F16K 24/04; F16K 27/0209; H01M 5/325; H01M 5/394; Y10T 137/789
See application file for complete search history.

(56) References Cited

U.S. PATENT DOCUMENTS 5,320,253 A * 6/1994 Robinson ............ A01M 7/0085
222/481.5
5,407,760 A * 4/1995 Kasner ................ H01M 50/333
429/89
(Continued)

FOREIGN PATENT DOCUMENTS

| JP | S62126671 U | 8/1987 |
| JP | H01158845 U | 11/1989 |
| JP | 2003004127 | 1/2003 |
| JP | 2003287150 | 10/2003 |
| JP | 2013168293 | 8/2013 |
| WO | 2018183804 | 10/2018 |

OTHER PUBLICATIONS

International Search Report and Written Opinion issued for International Patent Application No. PCT/JP2019/040955, dated Dec. 17, 2019, 12 pages including English translation of Search Report.

*Primary Examiner* — Hailey K. Do
(74) *Attorney, Agent, or Firm* — Hamre, Schumann, Mueller & Larson, P.C.

(57) ABSTRACT

A ventilation component (1a) is to be attached to a housing (2) at a ventilation opening (5). The ventilation component (1a) includes a gas-permeable membrane (10), a ventilation valve (20), and a structural member (30). The structural member (30) has an inner space (40), and at least one of a first ventilation path (51) and a second ventilation paths (52). The inner space (40) is a space accommodating the gas-permeable membrane (10) and/or the ventilation valve (20). The first ventilation path (51) allows the inner space (40) to communicate with an external space of the ventilation component (1a). The first ventilation path (51) has a first inner opening (51i) and a first outer opening (51e), and the (Continued)

first inner opening (51*i*) faces the first outer opening (51*e*). The first inner opening (51*i*) and the first outer opening (51*e*) are present along a plane parallel to an outer surface (2*s*) of the housing. The second ventilation path (52) has a second inner opening (52*i*) and a second outer opening (52*e*), and the second inner opening (52*i*) is present without facing the second outer opening (52*e*).

9 Claims, 5 Drawing Sheets

(51) Int. Cl.
*F16K 27/02* (2006.01)
*H01M 50/30* (2021.01)
*H05K 5/06* (2006.01)

(56) References Cited

U.S. PATENT DOCUMENTS

| | | | | |
|---|---|---|---|---|
| 5,704,522 | A * | 1/1998 | Orgeolet | B67D 7/44 |
| | | | | 222/571 |
| 7,166,024 | B2 * | 1/2007 | Mashiko | H02K 5/10 |
| | | | | 454/270 |
| 11,092,253 | B2 * | 8/2021 | Zaggl | F16K 17/02 |
| 2005/0257837 | A1 * | 11/2005 | Bailey | F16K 15/148 |
| | | | | 137/512.15 |
| 2009/0047890 | A1 * | 2/2009 | Yano | F21S 45/30 |
| | | | | 454/270 |
| 2018/0292020 | A1 | 10/2018 | Kleinke et al. | |

\* cited by examiner

VENTILATION COMPONENT

TECHNICAL FIELD

The present invention relates to a ventilation component.

BACKGROUND ART

Conventionally, ventilation components have been used for ventilation of a housing of a battery pack, etc.

For example, Patent Literature 1 describes a technique that provides a function of a ventilation hole to an explosion-proof valve of a battery pack to eliminate the need to separately provide a ventilation hole in which a gas-permeable membrane is. This explosion-proof valve includes an explosion-proof valve case, an O-ring, a gas-permeable membrane, and a protector. The explosion-proof valve case is a case that is formed of a synthetic resin and has an annular shape. The O-ring seals between the explosion-proof valve case and a pack case. The gas-permeable membrane is a circular sheet-like membrane attached to the case so as to close a central opening of the explosion-proof valve case. The protector is a circular plate-like member that is formed of a synthetic resin and is laid on the gas-permeable membrane outside. Notches as ventilation holes are provided around the protector, and a small amount of air can go in and out via the gas-permeable membrane. When an internal pressure rapidly rises at battery abnormality, the protector folds, and locking by locking projections is released to drop the protector, and therefore, a large passage cross-sectional area is secured instantaneously to release the internal pressure.

CITATION LIST

Patent Literature

Patent Literature 1: JP 2013-168293 A

SUMMARY OF INVENTION

Technical Problem

The explosion-proof valve described in Patent Literature 1 has room for improvement from the viewpoint of inhibiting a liquid, such as water and an oil, from entering into the explosion-proof valve. Therefore, the present invention provides a ventilation component that is suitable for releasing a pressure rapidly risen inside a housing and that is also advantageous from the viewpoint of inhibiting a liquid, such as water and an oil, from entering into the ventilation component.

Solution to Problem

The present invention provides a ventilation component to be attached to a housing at a ventilation opening of the housing, including:
a gas-permeable membrane;
a ventilation valve that includes an elastic body, and that is opened and closed by elastic deformation of the elastic body; and
a structural member that supports the gas-permeable membrane and the ventilation valve, wherein
in an attached state where the ventilation component is attached to the housing, ventilation between an inside of the housing and an outside of the housing is carried out via the gas-permeable membrane, and the ventilation valve is opened to discharge a gas inside the housing to the outside of the housing when a difference between a pressure inside the housing and a pressure outside the housing is equal to or higher than a predetermined value,
the structural member has an inner space accommodating the gas-permeable membrane and/or the ventilation valve, and at least one of a first ventilation path and a second ventilation path that allow the inner space to communicate with an external space of the ventilation component,
the first ventilation path has a first inner opening that is an opening adjacent to the inner space and a first outer opening that is an opening adjacent to the external space, at least a part of the first inner opening faces at least a part of the first outer opening, and the first inner opening and the first outer opening are, in the attached state, present along a plane parallel to an outer surface, of the housing, to which the ventilation component is attached, and
the second ventilation path has a second inner opening that is an opening adjacent to the inner space and a second outer opening that is an opening adjacent to the external space, and the second inner opening is present without facing the second outer opening.

Advantageous Effects of Invention

The ventilation component mentioned above is suitable for releasing the pressure rapidly risen inside the housing, and is also advantageous from the viewpoint of inhibiting a liquid, such as water and an oil, from entering into the explosion-proof valve.

DESCRIPTION OF EMBODIMENTS

Figure 1:
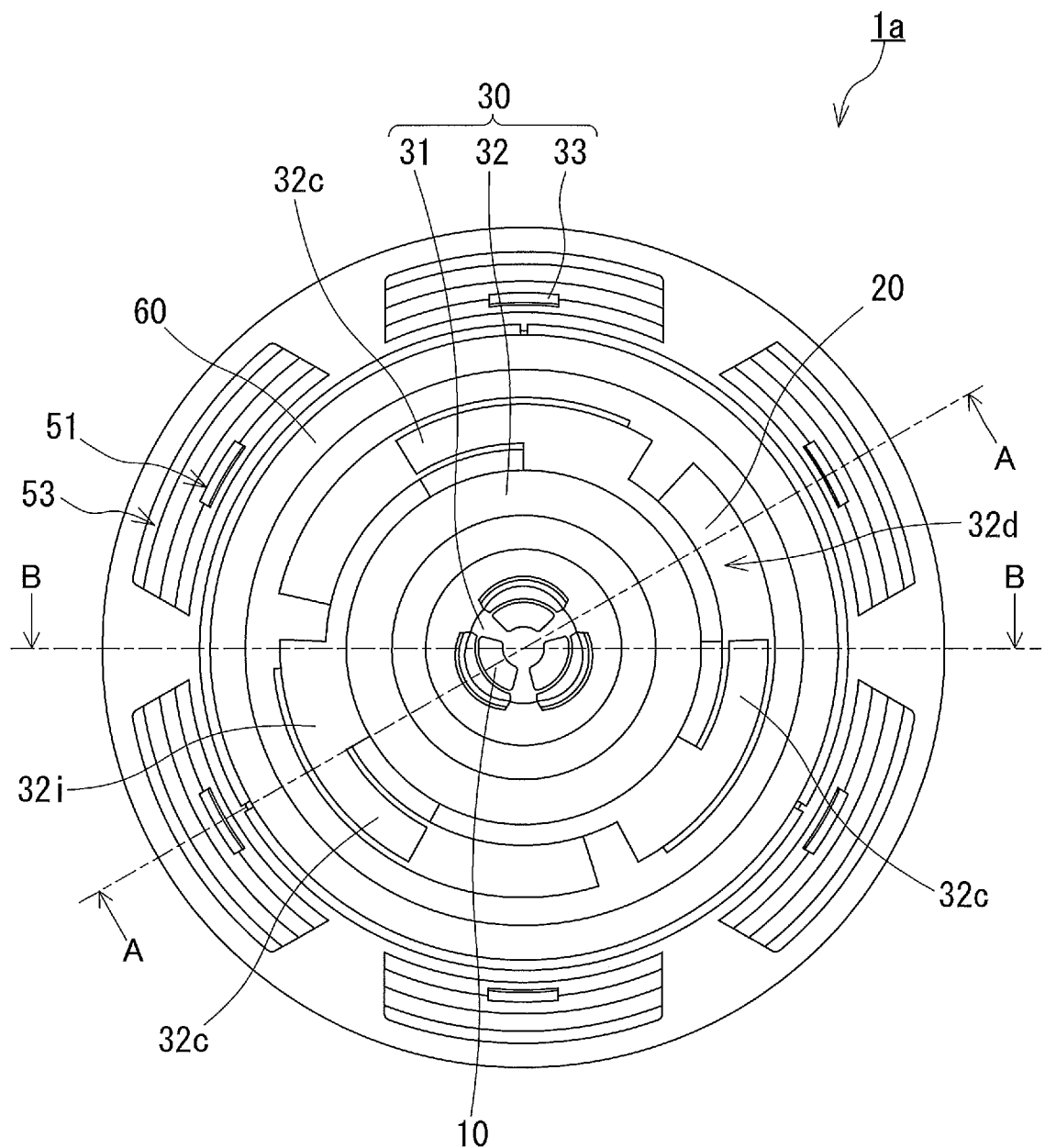
FIG. 1 is a bottom view illustrating an example of a ventilation component of the present invention.

A housing of an electrical component of a vehicle, for example, needs to have a ventilating property so as to eliminate a pressure difference that occurs inside thereof due to a temperature change. At the same time, the level of ventilating property required for the housing can vary according to a phenomenon inside the housing. For example, there is a case, such as explosion prevention on a battery pack, in which a lot of gas is required to be discharged from inside of a housing in a short time. Accordingly, it is conceivable to attach a ventilation component including a gas-permeable membrane and a ventilation valve to a ventilation opening of a housing. In this case, regular ventilation is carried out via the gas-permeable membrane in a state where the ventilation valve is closed and, on the other hand, when a difference between a pressure inside the housing and a pressure outside the housing increases to be equal to or higher than a predetermined value, the ventilation valve is opened to discharge a lot of gas in a short time, for example. It is possible to reuse the ventilation valve by using, as the ventilation valve, a ventilation valve that is opened and closed by elastic deformation of an elastic body thereof. According to the explosion-proof valve described in Patent Literature 1, when an internal pressure of the pack case rapidly rises, the internal pressure acts directly on the protector and the protector is warped and deformed in such a manner as to be folded along a slit. Thus, Patent Literature 1 has no description about using a ventilation valve that is opened and closed by elastic deformation of an elastic body thereof.

It is assumed that when a vehicle runs in rain or is washed, a ventilation component thereof is in contact with a lot of water. In this case, there is a possibility that entry of the water into the ventilation component will deteriorate members, such as a gas-permeable membrane and a ventilation valve, included in the ventilation component, and ventilation is unlikely to be carried out properly. In light of this, the present inventors made intensive studies on a ventilation component including a gas-permeable membrane and a ventilation valve from the viewpoint of inhibiting a liquid, such as water and an oil, from entering into the ventilation component. As a result, they came up with a new configuration in which a structural member that supports the gas-permeable membrane and the ventilation valve has a predetermined ventilation path, and have invented a ventilation component of the present invention. It should be noted that a housing to which the ventilation component of the present invention is to be attached is not limited to a housing of an electrical component of a vehicle.

Hereinbelow, embodiments of the present invention will be described with reference to the accompanying drawings. The following description describes examples of the present invention, and the present invention is not limited to the following embodiments.

Figure 2A:
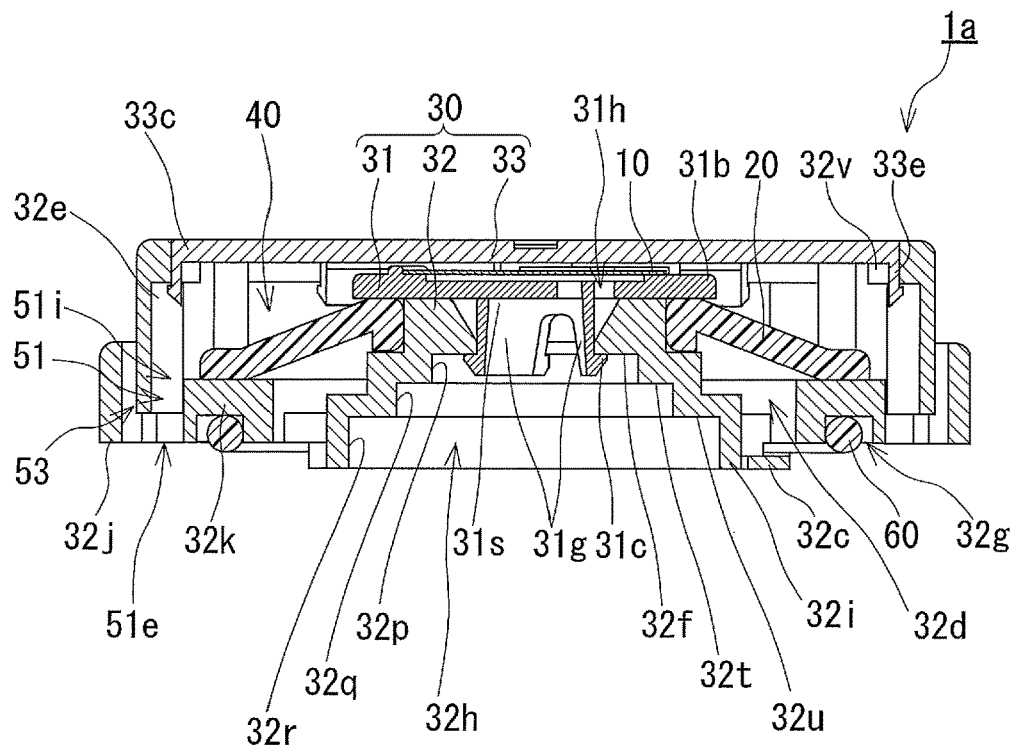
FIG. 2A is a cross-sectional view of the ventilation component shown in FIG. 1, taken along line A-A.
Figure 2B:
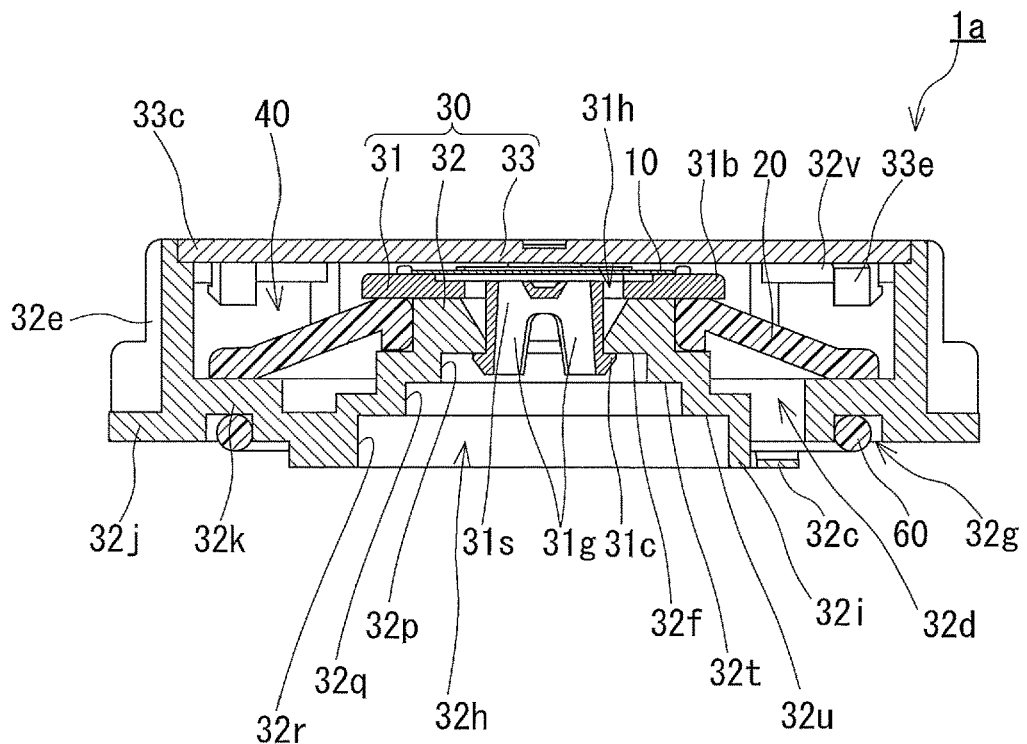
FIG. 2B is a cross-sectional view of the ventilation component shown in FIG. 1, taken along line B-B.
Figure 3:
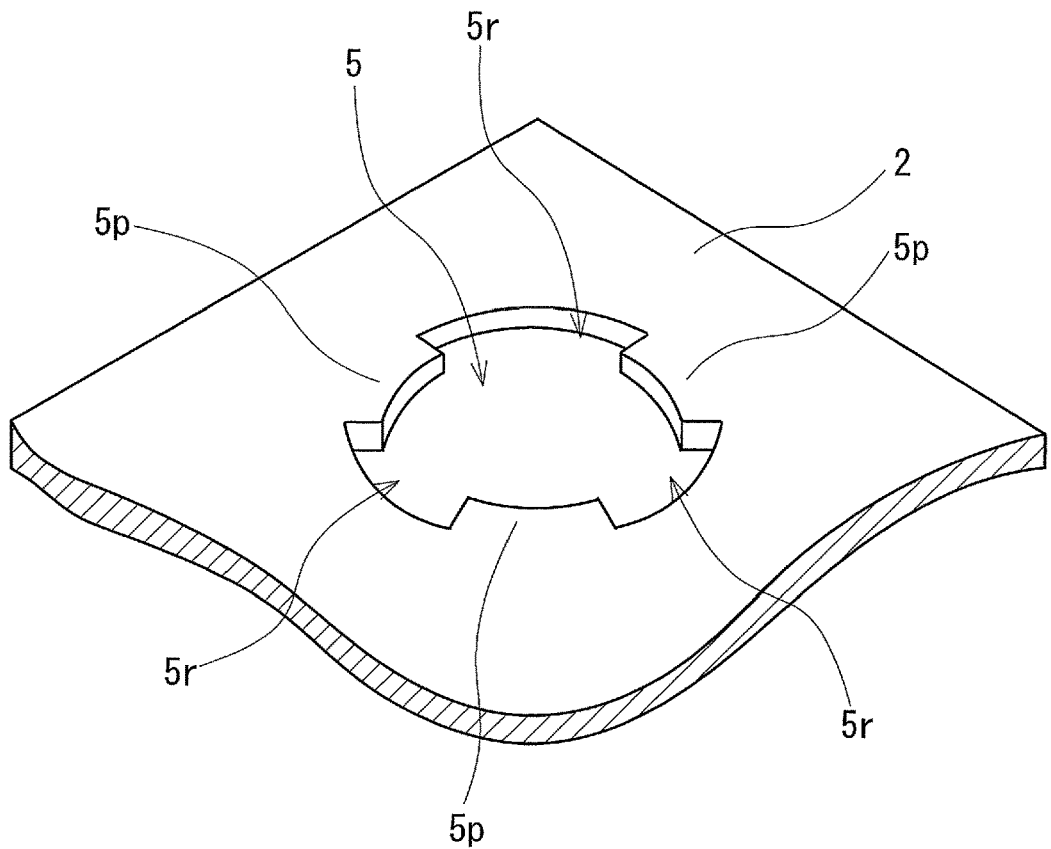
FIG. 3 is a perspective view illustrating a ventilation opening of a housing.
Figure 4:
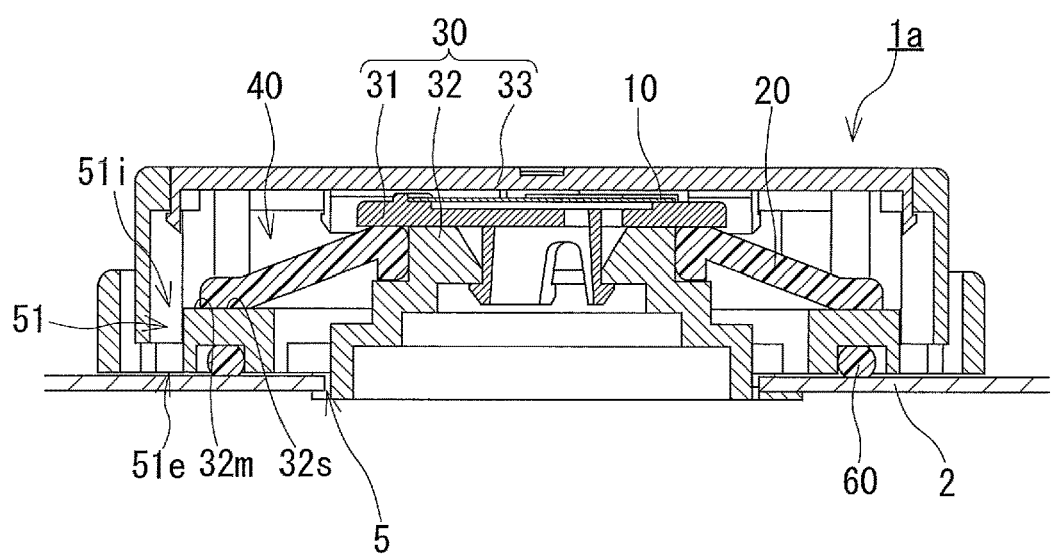
FIG. 4 is a cross-sectional view illustrating a state where the ventilation component is attached to the housing.
Figure 5:
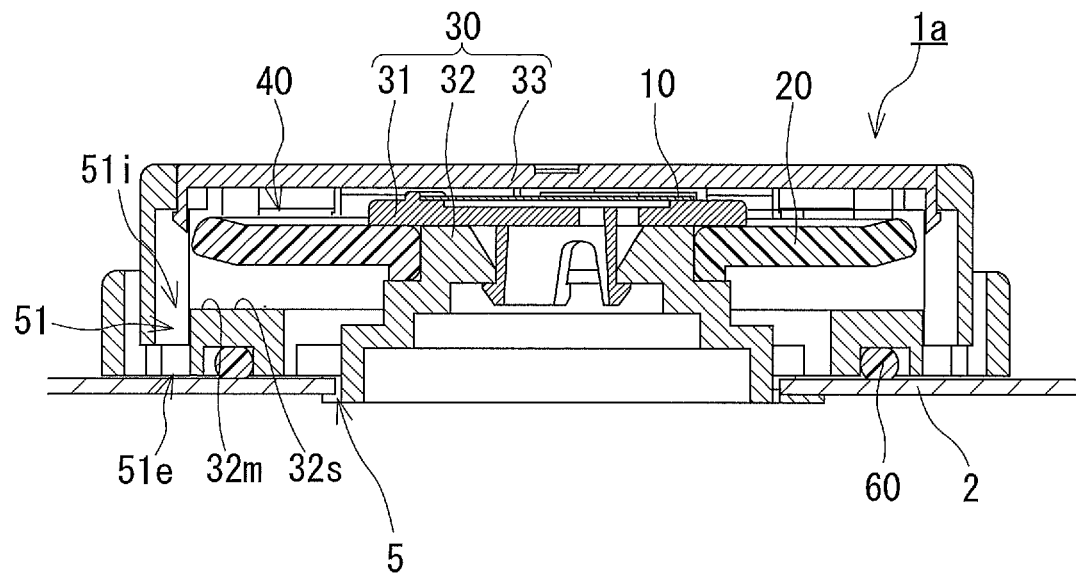
FIG. 5 is a cross-sectional view illustrating a state where a ventilation valve is opened.
Figure 6:
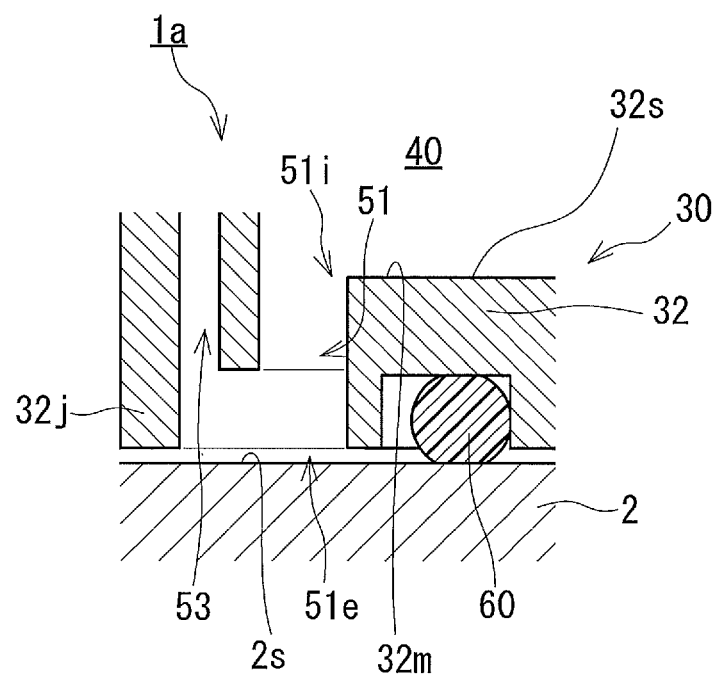
FIG. 6 is a partially-enlarged cross-sectional view of FIG. 4.

As shown in FIG. 1, FIG. 2A, and FIG. 2B, a ventilation component 1a includes a gas-permeable membrane 10, a ventilation valve 20, and a structural member 30. The ventilation component 1a is a component to be attached to a housing 2 having a ventilation opening 5 as shown in FIG. 3. As shown in FIG. 4, the ventilation component 1a is to be attached to the housing 2 at the ventilation opening 5. As shown in FIG. 4 and FIG. 5, the ventilation valve 20 includes an elastic body, and is opened and closed by elastic deformation of the elastic body. The structural member 30 supports the gas-permeable membrane 10 and the ventilation valve 20. In an attached state where the ventilation component 1a is attached to the housing 2, ventilation between an inside of the housing 2 and an outside of the housing 2 is carried out via the gas-permeable membrane 10. Furthermore, in the attached state, the ventilation valve 20 is opened to discharge a gas inside the housing 2 to the outside of the housing 2 when a difference between a pressure inside the housing 2 and a pressure outside the housing 2 is equal to or higher than a predetermined value. In other words, the difference between the pressure inside the housing 2 and the pressure outside the housing 2 is less than the predetermined value, the ventilation valve 20 is closed. The structural member 30 has an inner space 40 and a first ventilation path 51. The inner space 40 is a space accommodating the gas-permeable membrane 10 and/or the ventilation valve 20. In the ventilation component 1a, the inner space 40 accommodates the gas-permeable membrane 10 and the ventilation valve 20. The first ventilation path 51 allows the inner space 40 to communicate with an external space of the ventilation component 1a. The first ventilation path 51 has a first inner opening 51i and a first outer opening 51e. In the first ventilation path 51, the first inner opening 51i is an opening that is adjacent to the inner space 40. In the first ventilation path 51, the first outer opening 51e is an opening that is adjacent to the external space of the ventilation component 1a. As shown in FIG. 6, at least a part of the first inner opening 51i faces at least a part of the first outer opening 51e. In other words, when an inside of the first ventilation path 51 is viewed from the first outer opening 51e, at least a part of the first inner opening 51i can be recognized visually. In the attached state, the first inner opening 51i and the first outer opening 51e are present along a plane parallel to an outer surface 2s, of the housing 2, to which the ventilation component 1a is attached, as shown in FIG. 6. In this case, a liquid, such as water, is unable to reach the inner space 40 unless it moves in a direction perpendicular to the outer surface 2s. Accordingly, the liquid is unlikely to be guided to the inner space 40, and it is possible to inhibit the liquid from being brought into contact with the gas-permeable membrane 10 or the ventilation valve 20.

Figure 7:
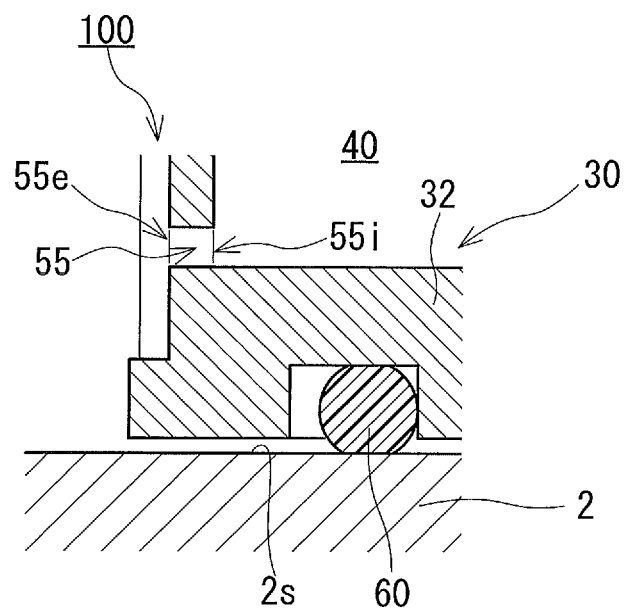
FIG. 7 is a partially-enlarged cross-sectional view of a ventilation component according to a reference example.

As shown in FIG. 7, in a ventilation component 100 according to a reference example, the structural member 30 has a ventilation path 55 instead of the first ventilation path 51. The ventilation component 100 is configured in the same manner as the ventilation component 1a except portions particularly otherwise described. The ventilation path 55 allows the inner space 40 to communicate with an external space of the ventilation component 100. The ventilation path 55 has an inner opening 55i and an outer opening 55e. At least a part of the inner opening 55i faces at least a part of the outer opening 55e. On the other hand, in an attached state where the ventilation component 100 is attached to the housing 2, opening faces that the inner opening 55i and the outer opening 55e respectively form are perpendicular to the plane parallel to the outer surface 2s of the housing 2. In the ventilation component 100, when the liquid moves along a direction parallel to the outer surface 2s of the housing 2, the liquid is likely to be guided to the inner space 40 through the ventilation path 55. Thus, in the ventilation component 100, the gas-permeable membrane 10 and the ventilation valve 20 are likely to be deteriorated by the liquid.

In the attached state, the first outer opening 51e is positioned closer to the outer surface 2s of the housing 2 than the first inner opening 51i is in the direction perpendicular to the outer surface 2s of the housing 2, for example, as shown in FIG. 6. In this case, when the liquid moves toward the outer surface 2s of the housing 2, the liquid is unlikely to be guided to the inner space 40 through the first ventilation path 51, for example.

In the attached state, the first outer opening 51e faces the outer surface 2s of the housing 2, for example, as shown in FIG. 6. In this case, the liquid, such as water, is unable to reach the inner space 40 unless it moves in the direction perpendicular to the outer surface 2s. Thus, the liquid is unlikely to be guided to the inner space 40.

As shown in FIG. 4 and FIG. 5, the structural member 30 has a seating face 32s, for example. The seating face 32s is a face with which the ventilation valve 20 is in contact in a state where the ventilation valve 20 is closed and with which the ventilation valve 20 is out of contact in a state where the ventilation valve 20 is opened. In the ventilation component 1a, the first inner opening 51i is present on a plane including the seating face 32s, for example. Even if the liquid reaches a vicinity of the seating face 32s through the first ventilation path 51, the liquid is thereafter likely to be discharged from the inner space 40 through the first ventilation path 51 and is unlikely to remain in the inner space 40. As a result, deterioration of the gas-permeable membrane 10 and the ventilation valve 20 can be inhibited.

As shown in FIG. 4 and FIG. 5, the structural member 30 has a flat surface 32m, for example. The flat surface 32m includes the seating face 32s and extends flat to the first inner opening 51i. In this case, even if the liquid reaches the vicinity of the seating face 32s through the first ventilation path 51, the liquid is thereafter likely to be discharged from the inner space 40 along the flat surface 32m and through the first ventilation path 51. Thus, the liquid is unlikely to remain in the inner space 40. As a result, deterioration of the gas-permeable membrane 10 and the ventilation valve 20 can be inhibited.

In the attached state, the structural member 30 has no ventilation path that allows the inner space 40 to communicate with the external space of the ventilation component 100, in a portion that is more distant from the outer surface 2s than the seating face 32s is in the direction perpendicular to the outer surface 2s of the housing 2, as shown in FIG. 4. In this case, the liquid is not directly guided to the inner space 40 from an external space that is more distant from the outer surface 2s than the seating face 32s is in the direction perpendicular to the outer surface 2s.

As shown in FIG. 2A and FIG. 2B, the structural member 30 has an engagement portion 32c, for example. The engagement portion 32c is to be inserted into the ventilation opening 5 of the housing 2. The ventilation component 1a further includes a seal member 60, for example. As shown in FIG. 4, the seal member 60 seals a gap between the structural member 30 and the outer surface 2s of the housing 2 in the attached state. This can inhibit the liquid from being guided to the inside of the housing 2 even when the housing 2 is brought into contact with the liquid and the liquid flows along the outer surface 2s of the housing 2. The seal member 60 is an O-ring or a packing, for example. Examples of a material of the seal member 60 include an elastically-deformable material.

As shown in FIG. 2A and FIG. 2B, the structural member 30 has an outward protruding portion 32j, for example. In the attached state, the outward protruding portion 32j is positioned between the first inner opening 51i and the first outer opening 51e in the direction perpendicular to the outer surface 2s of the housing 2, and protrudes to an outer circumferential side beyond the first outer opening 51e along the direction parallel to the outer surface 2s of the housing 2. The outward protruding portion 32j faces the outer surface 2s of the housing 2, for example. In this case, the liquid is unable to reach the first outer opening 51e unless it passes through a space between the outward protruding portion 32j and the outer surface 2s of the housing 2. Thereby, the liquid is more unlikely to be guided to the inner space 40. The outward protruding portion 32j has a surface that faces the outer surface 2s of the housing 2, and the surface is, for example, included in a plane including the opening face of the first outer opening 51e.

The gas-permeable membrane 10 is not limited to a specific gas-permeable membrane as long as it has a desired ventilating property. The gas-permeable membrane 10 may be a single layer membrane, or may be a multilayer membrane. In the case where the gas-permeable membrane 10 is a multilayer membrane, each layer thereof can be one selected from the group consisting of a porous membrane, a nonwoven fabric, a cloth, and a mesh. The gas-permeable membrane 10 may include: a porous membrane and a nonwoven fabric; at least one of a cloth and a mesh, and a porous membrane; or a plurality of nonwoven fabrics. Typically, the gas-permeable membrane 10 is composed of an organic polymer material (resin). Examples of a material of the porous membrane include fluororesin. As the fluororesin, there can be used polytetrafluoroethylene (PTFE), polychlorotrifluoroethylene, a tetrafluoroethylene-hexafluoropropylene copolymer, or a tetrafluoroethylene-ethylene copolymer, for example. Examples of a material of each of the nonwoven fabric, the cloth, and the mesh include polyester, such as polyethylene terephthalate, polyolefin, such as polyethylene and polypropylene, nylon, aramid, and an ethylene-vinyl acetate copolymer.

The gas-permeable membrane 10 may be subject to a liquid-repellent treatment as necessary. The liquid-repellent treatment is carried out by forming, on the gas-permeable membrane 10, a liquid-repellant coating film containing a fluorine-based surface modifier having a perfluoroalkyl group, for example. The formation of the liquid-repellant coating film is not particularly limited, and it is carried out, for example, by coating a resin porous membrane with a solution or dispersion of the fluorine-based surface modifier having a perfluoroalkyl group by a method such as an air spray method, an electrostatic spray method, a dip coating method, a spin coating method, a roll coating method, a curtain flow coating method, and an impregnation method. Alternatively, the liquid-repellant coating film may be formed by an electrodeposition method or a plasma polymerization method.

The ventilation valve 20 is opened by its elastic deformation and is closed by returning to a shape that it had before the deformation. Thereby, the ventilation valve 20 can be opened and closed repeatedly, and can be used repeatedly. This brings an advantage that a product in which the ventilation component 1a is attached to the housing 2 can be shipped after being inspected to see whether the ventilation valve 20 works normally.

The elastic body included in the ventilation valve 20 is not particularly limited as long as it is an elastically-deformable material, and it is, for example, a natural rubber, a synthetic rubber, or an elastomer such as a thermoplastic elastomer. In this case, examples of the synthetic rubber include a nitrile butadiene rubber (NBR), an ethylene propylene rubber (EPDM), a silicone rubber, a fluororubber, an acrylic rubber, and a hydrogenated nitrile rubber. Desirably, the ventilation valve 20 includes a silicone rubber as the elastic body. These elastic bodies can also be used as a material of the seal member 60.

The ventilation valve 20 is a kind of so-called umbrella valve (an umbrella-type release valve), and is an annular member in which a valve portion has a through hole at a center thereof when viewed in plane, for example. The umbrella valve usually includes a valve portion that serves for opening and closing, and a shaft portion that supports the valve portion. There is also an umbrella valve that has a member forming the valve portion and another separate member forming the shaft portion. For example, the ventilation valve 20 forms the valve portion only, and the valve portion has an annular shape when viewed in plane. The structural member 30 functions as the shaft portion supporting the ventilation valve 20 that is the valve portion. The through hole of the ventilation valve 20 is used to support the ventilation valve 20 by using the structural member 30. Moreover, when the ventilation component 1a is viewed in plane, the gas-permeable membrane 10 is arranged in such a manner that an entirety of the gas-permeable membrane 10 coincides with a space in the through hole of the ventilation valve 20, for example. As described herein, the through hole of the ventilation valve 20 has a size sufficient enough to accommodate the gas-permeable membrane 10.

The ventilation valve 20 is not limited to one with a particular shape as long as the ventilation valve 20 is opened by its elastic deformation and is closed by returning to a shape that it had before the deformation. The ventilation valve 20 may be a type of so-called duckbill valve, or may be a type of umbrella valve. In the case where the ventilation valve 20 is an umbrella valve, the ventilation valve 20 may include the valve portion and the shaft portion, or may be composed only of the valve portion. In the case where the ventilation valve 20 is an umbrella valve composed only of the valve portion, the ventilation valve 20 may have a through hole, or may not have a through hole. In the case where the ventilation valve 20 is an umbrella valve having a through hole, the through hole has a shape that is not limited to a specific one and the through hole has dimensions that are not limited to specific values.

As shown in FIG. 2A and FIG. 2B, the structural member 30 has a first member 31, a second member 32, and a third member 33, for example. The first member 31 supports the gas-permeable membrane 10. The first member 31 includes a base portion 31b and a shaft portion 31s. The base portion 31b has a disk shape and supports the gas-permeable membrane 10. The base portion 31b has, at a center thereof, a through hole 31h for ventilation. The base portion 31b supports a peripheral portion of the gas-permeable membrane 10 outside the through hole 31h in a direction perpendicular to an axis of the base portion 31b. The gas-permeable membrane 10 is fixed to the base portion 31b by a method such as thermal welding, ultrasonic welding, and bonding with an adhesive. The shaft portion 31s protrudes from the center of the base portion 31b to an axial direction of the base portion 31b. The shaft portion 31s is cylindrical, and has a plurality (three, for example) of leg portions 31g at positions away from the base portion 31b in the axial direction of the base portion 31b. The leg portions 31g are arranged to be away from each other at equal angles around the axis of the base portion 31b, for example. Each of the leg portions 31g has, at a tip thereof, an engagement portion 31c protruding in the direction perpendicular to the axis of the base portion 31b. Air goes in and out through an inside of the base portion 31s, or through a gap between the leg portions 31g and the through hole 31h to carry out ventilation.

The second member 32 forms a bottom portion and a side portion of the structural member 30, and supports the ventilation valve 20. The ventilation valve 20 is an annular umbrella valve having a through hole at a center thereof, and the second member 32 forms a shaft portion of the umbrella valve, for example. The second member 32 is an annular member, and includes an inner circumferential portion 32i, an outer circumferential portion 32e, and a connecting portion 32k. The inner circumferential portion 32i is positioned at a center of the second member 32 and is cylindrical. The outer circumferential portion 32e is away from the inner circumferential portion 32i in a direction perpendicular to an axis of the inner circumferential portion 32i, and surrounds the inner circumferential portion 32i. The outer circumferential portion 32e is cylindrical. The outer circumferential portion 32e forms the side portion of the structural member 30. The connecting portion 32k is positioned between the outer circumferential portion 32e and the inner circumferential portion 32i in the direction perpendicular to the axis of the inner circumferential portion 32i, and connects the outer circumferential portion 32e to the inner circumferential portion 32i. The inner circumferential portion 32i and the connecting portion 32k form the bottom portion of the structural member 30. The inner circumferential portion 32i has, at a center thereof, an attaching hole 32h that is a through hole. The first member 31 is attached to the second member 32 at one end portion of the inner circumferential portion 32i in an axial direction of the inner circumferential portion 32i. At the one end portion of the inner circumferential portion 32i, the attaching hole 32h forms a tapered hole. In addition, the inner circumferential portion 32i has an annular engagement face 32f that is adjacent to the tapered hole and extends in the direction perpendicular to the axis of the inner circumferential portion 32i. The shaft portion 31s is inserted into the tapered hole of the attaching hole 32h, and thus the engagement portions 31c face the engagement face 32f so as to prevent the first member 31 from being out of the attaching hole 32h. Moreover, an end face, adjacent to the tapered hole, of the inner circumferential portion 32i in the axial direction of the inner circumferential portion 32i faces a bottom face of the base portion 31b of the first member 31.

The inner circumferential portion 32i has an inner circumferential surface that is formed in such a manner as to make a plurality (three, for example) of steps from the engagement face 32f toward the other end portion of the inner circumferential portion 32i. For example, the inner circumferential surface of the inner circumferential portion 32i has a first side face 32p, a second side face 32q, a third side face 32r, a first connecting face 32t, and a second connecting face 32u. The first side face 32p, the second side face 32q, and the third side face 32r extend in the axial direction of the inner circumferential portion 32i. In addition, the first side face 32p, the second side face 32q, and the third side face 32r respectively have a first inner diameter, a second inner diameter, and a third inner diameter. The first inner diameter is smaller than the second inner diameter, and the second inner diameter is smaller than the third inner diameter. The first connecting face 32t and the second connecting face 32u extend in the direction perpendicular to the axis of the inner circumferential portion 32i. The first connecting face 32t connects the first side face 32p to the second side face 32q. The second connecting face 32u connects the second side face 32q to the third side face 32r.

As shown in FIG. 1, the inner circumferential portion 32i includes a plurality (three, for example) of the engagement portions 32c, for example. The engagement portions 32c protrude outwardly in the direction perpendicular to the axis of the inner circumferential portion 32i at the other end portion of the inner circumferential portion 32i in the axial direction of the inner circumferential portion 32i, for example. The engagement portions 32c each are a plate-like portion curved in a circular arc shape. The engagement portions 32c are arranged to be away from each other at equal angles around the axis of the inner circumferential portion 32i, for example. In the housing 2, a part of the ventilation opening 5 is formed by a plurality (three, for example) of protruding portions 5p. The protruding portions 5p are arranged to be away from each other at equal angles around an axis of the ventilation opening 5. A plurality of recesses 5r forming a part of the ventilation opening 5 are present between the protruding portions 5p. At the time of attaching the ventilation component 1a to the housing 2, the ventilation component 1a is inserted into the ventilation opening 5 in such a manner that the engagement portions 32c pass respectively through the recesses 5r. Then, the ventilation component 1*a* is rotated by a predetermined angle around the axis of the inner circumferential portion 32*i* so that the engagement portions 32*c* face the protruding portions 5*p* inside the housing 2, and thereby the ventilation component 1*a* is attached to the housing 2. The protruding portions 5*p* and the engagement portions 32*c* work together to prevent the ventilation component 1*a* from being detached from the housing 2.

The ventilation valve 20 is attached to the inner circumferential portion 32*i* in such a manner as to be firmly in contact with an outer circumferential surface of the inner circumferential portion 32*i*. For example, the through hole of the ventilation valve 20 has a diameter that is determined so that the ventilation valve 20 can be firmly in contact with the outer circumferential surface of the inner circumferential portion 32*i*.

The connecting portion 32*k* functions as a valve seat for the ventilation valve 20, for example. In other words, the connecting portion 32*k* has the seating face 32*s*. The seating face 32*s* is positioned in a peripheral portion of the connecting portion 32*k*. The connecting portion 32*k* has a flow path 32*d* to allow a gas to flow therethrough. The flow path 32*d* is formed in such a manner that it extends in the axial direction of the inner circumferential portion 32*i* between the seating face 32*s* and the inner circumferential portion 32*i*. The flow path 32*d* causes the ventilation valve 20 to be subject to the pressure inside the housing 2. The connecting portion 32*k* further has an annular recess 32*g*, for example. The seal member 60 is accommodated in the annular recess 32*g*. The annular recess 32*g* is formed in a bottom face of the connecting portion 32*k* in such a manner as to overlap with the seating face 32*s* in the direction perpendicular to the axis of the inner circumferential portion 32*i*, for example.

The outer circumferential portion 32*e* extends along the axial direction of the inner circumferential portion 32*i* outside the connecting portion 32*k*. The first ventilation path 51 is formed between the connecting portion 32*k* and an inner surface of the outer circumferential portion 32*e*, for example.

The outer circumferential portion 32*e* has the outward protruding portion 32*j* protruding outwardly in the direction perpendicular to the axis of the inner circumferential portion 32*i*. A ventilation path 53 is formed in the outward protruding portion 32*j*. The ventilation path 53 extends through the outward protruding portion 32*j* in the axial direction of the inner circumferential portion 32*i*. Apart of the gas having passed through the first ventilation path 51 passes through the ventilation path 53 to be discharged.

The outer circumferential portion 32*e* has a plurality of inward protruding portions 32*v*, for example. The inward protruding portions 32*v* protrude inwardly in the direction perpendicular to the axis of the inner circumferential portion 32*i* at one end portion of the outer circumferential portion 32*e* in the axial direction of the inner circumferential portion 32*i*. The inward protruding portions 32*v* are arranged to be away from each other at predetermined intervals around the axis of the inner circumferential portion 32*i*.

The third member 33 is a member with a disk shape. The third member 33 forms, together with the second member 32, the inner space 40. The third member 33 is a member for covering the gas-permeable membrane 10 and the ventilation valve 20. The third member 33 has a cover 33*c* with a disk shape, and an engagement claw 33*e*. The engagement claw 33*e* protrudes in an axial direction of the cover 33*c* from a peripheral portion of one principal surface of the cover 33*c*. A tip portion of the engagement claw 33*e* protrudes outwardly in a direction perpendicular to an axis of the cover 33*c*. The third member 33 is inserted into the outer circumferential portion 32*e* in such a manner that the engagement claw 33*e* passes through a gap between the inward protruding portions 32*v*. Then, the third member 33 is rotated around the axis of the cover 33*c* by a predetermined angle so that the tip portion of the engagement claw 33*e* faces the inward protruding portions 32*v*. In this way, the third member 33 is attached to the second member 32. The fact that the tip portion of the engagement claw 33*e* faces the inward protruding portions 32*v* prevents the third member 33 from being detached from the second member 32.

Examples of a material of the structural member 30 include a synthetic resin and a metal. As the synthetic resin, a thermoplastic resin can be used, for example. Examples of the thermoplastic resin include polybutylene terephthalate (PBT), polyethylene terephthalate (PET), polyphenylene sulfide (PPS), polysulfone (PS), polypropylene (PP), polyethylene (PE), and an ABS resin. The material of the structural member 30 may be a composite material containing the thermoplastic resin as a matrix. In this case, a reinforcement to be added to the composite material can be glass fiber, carbon fiber, a metal, or an inorganic filler.

As shown in FIG. 4, when the difference between the pressure inside the housing 2 and the pressure outside the housing 2 is less than the predetermined value, the ventilation valve 20 is closed, which makes it impossible for the gas inside the housing 2 to move to the outside of the housing 2 through the flow path 32*d*. Therefore, the gas goes into and out from the housing 2 through a flow path including the attaching hole 32*h* of the inner circumferential portion 32*i*, the through hole 31*h* of the first member 31, the gas-permeable membrane 10, the inner space 40, and the first ventilation path 51. In contrast, as shown in FIG. 5, when the difference between the pressure inside the housing 2 and the pressure outside the housing 2 is equal to or higher than the predetermined value, the ventilation valve 20 is opened and the gas inside the housing 2 is discharged to the outside of the housing 2 through a flow path including the flow path 32*d*, the inner space 40, and the first ventilation path 51. It should be noted that there is a case where a rapid rise of the pressure inside the housing damages the gas-permeable membrane, etc. even when the ventilation valve is provided. However, the ventilation component 1*a* has a structure that can inhibit such a phenomenon. As a means to prevent the damage of the gas-permeable membrane, etc., it can be considered to provide a structure that allows the gas inside the housing to be discharged to the outside of the housing via the ventilation valve. For that purpose, it is important to adjust a size of a cross section of a flow path through which the gas passes, and a size of the valve portion of the ventilation valve that closes the flow path. The ventilation component 1*a* has an annular shape in which the ventilation valve 20 has a through hole at a center thereof when viewed in plane. Furthermore, the ventilation component 1*a* has a structure in which the gas-permeable membrane 10 is accommodated in such a manner that the gas-permeable membrane 10 is positioned inner than the inner circumferential surface forming the through hole of the ventilation valve 20 when viewed in plane. Thus, the cross section of the flow path through which the gas passes and the valve portion of the ventilation valve 20 are secured as large as possible in a limited space in the ventilation component 1*a*. Therefore, when the pressure inside the housing 2 rises rapidly, the ventilation valve 20 is opened and the gas is discharged promptly to the outside of the housing 2 through the flow path including the flow path 32d, the inner space 40, and the first ventilation path 51.

Figure 8:
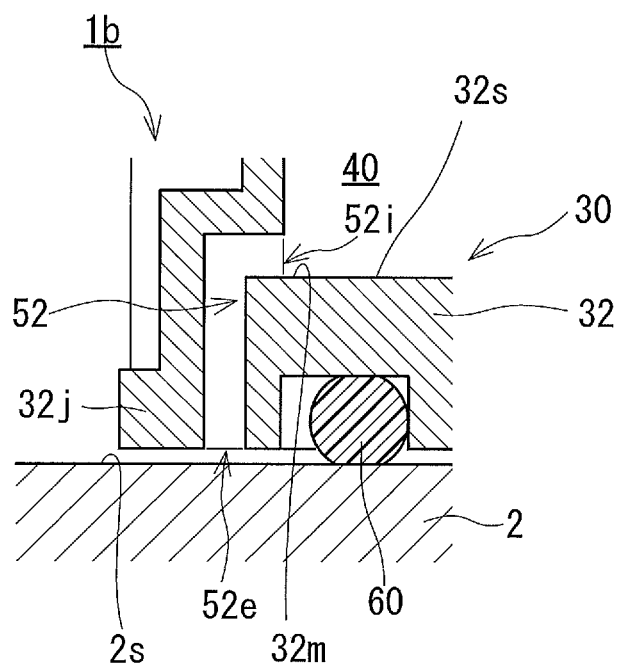
FIG. 8 is a partially-enlarged cross-sectional view of another example of the ventilation component according to the present invention.

The ventilation component 1a can be modified in various respects. The ventilation component 1a may be modified into a ventilation component 1b shown in FIG. 8, for example. The ventilation component 1b is configured in the same manner as the ventilation component 1a except portions particularly otherwise described. Constituent elements of the ventilation component 1b that are identical to or corresponding to those of the ventilation component 1a are indicated by the same reference numerals, and detailed descriptions thereof will be omitted. The description given for the ventilation component 1a is applicable to the ventilation component 1b unless there is a technical inconsistency. In FIG. 8, the ventilation valve 20 is omitted for convenience.

In the ventilation component 1b, the structural member 30 has a second ventilation path 52 as shown in FIG. 8. The second ventilation path 52 allows the inner space 40 to communicate with an external space of the ventilation component 1b. The second ventilation path 52 has a second inner opening 52i and a second outer opening 52e. The second inner opening 52i is an opening adjacent to the inner space 40. The second outer opening 52e is an opening adjacent to the external space of the ventilation component 1b. The second inner opening 52i is present without facing the second outer opening 52e. In other words, when an inside of the second ventilation path 52 is viewed from the second outer opening 52e, the second inner opening 52i is unrecognizable visually. In this case, a liquid, such as water, is unable to reach the inner space 40 unless a direction of movement of the liquid is changed in the second ventilation path 52. Thus, the liquid is unlikely to be guided to the inner space 40, making it possible to inhibit the liquid from being in contact with the gas-permeable membrane 10 or the ventilation valve 20.

In the attached state, the second outer opening 52e is positioned closer to the outer surface 2s of the housing 2 than the second inner opening 52i is in the direction perpendicular to the outer surface 2s of the housing 2, for example, as shown in FIG. 8. In this case, when a liquid moves toward the outer surface 2s of the housing 2, for example, the liquid is unlikely to be guided to the inner space 40 through the second ventilation path 52.

In the attached state, the second outer opening 52e faces the outer surface 2s of the housing 2, for example, as shown in FIG. 8. In this case, a liquid, such as water, is unable to reach the inner space 40 unless it moves in the direction perpendicular to the outer surface 2s. Thus, the liquid is unlikely to be guided to the inner space 40.

As shown in FIG. 8, a plane including the second inner opening 52i intersects the plane including the seating face 32s in the ventilation component 1b, for example. Even if a liquid reaches the vicinity of the seating face 32s through the second ventilation path 52, the liquid is thereafter likely to be discharged from the inner space 40 through the second ventilation path 52, and the liquid is unlikely to remain in the inner space 40. As a result, deterioration of the gas-permeable membrane 10 and the ventilation valve 20 can be inhibited.

As shown in FIG. 8, the flat surface 32m includes the seating face 32s and extends flat to the second inner opening 52i. Even if the liquid reaches the vicinity of the seating face 32s through the second ventilation path 52, the liquid is thereafter likely to be discharged from the inner space 40 along the flat surface 32m and through the second ventilation path 52. Thus, the liquid is unlikely to remain in the inner space 40. As a result, deterioration of the gas-permeable membrane 10 and the ventilation valve 20 can be inhibited.

In the ventilation component 1b, the structural member 30 has the outward protruding portion 32j, for example, as shown in FIG. 8. In the attached state, the outward protruding portion 32j is positioned between the second inner opening 52i and the second outer opening 52e in the direction perpendicular to the outer surface 2s of the housing 2, and protrudes to an outer circumferential side beyond the second outer opening 52e along the direction parallel to the outer surface 2s of the housing 2. The outward protruding portion 32j faces the outer surface 2s of the housing 2, for example. In this case, the liquid in unable to reach the second outer opening 52e unless it passes through the space between the outward protruding portion 32j and the outer surface 2s of the housing 2. Thus, the liquid is more unlikely to be guided to the inner space 40. The outward protruding portion 32j has a surface that faces the outer surface 2s of the housing 2, and the surface is, for example, included in a plane including the opening face of the second outer opening 52e.

The invention claimed is:

1. A ventilation component to be attached to a housing at a ventilation opening of the housing, comprising:
    a gas-permeable membrane;
    a ventilation valve that includes an elastic body, and that is opened and closed by elastic deformation of the elastic body; and
    a structural member that supports the gas-permeable membrane and the ventilation valve, wherein
    the ventilation is configured such that when the ventilation component is attached to the housing, ventilation between an inside of the housing and an outside of the housing is carried out via the gas-permeable membrane, and the ventilation valve is opened to discharge a gas inside the housing to the outside of the housing when a difference between a pressure inside the housing and a pressure outside the housing is equal to or higher than a predetermined value,
    the structural member has an inner space accommodating the gas-permeable membrane and/or the ventilation valve, and at least one of a first ventilation path and a second ventilation path that allow the inner space to communicate with an external space of the ventilation component,
    the first ventilation path has a first inner opening that is an opening adjacent to the inner space and a first outer opening that is an opening adjacent to the external space, at least a part of the first inner opening faces at least a part of the first outer opening, and the first inner opening and the first outer opening are configured so that, when the ventilation component is attached to the housing, the first inner opening and the first outer opening are present along a plane parallel to an outer surface of the housing, and
    the second ventilation path has a second inner opening that is an opening adjacent to the inner space and a second outer opening that is an opening adjacent to the external space, and the second inner opening is present without facing the second outer opening.

2. The ventilation component according to claim 1, wherein the ventilation valve is an umbrella-type release valve, and the ventilation valve has an annular ring-shaped valve portion having, at a center thereof, a through hole when viewed in plane.

3. The ventilation component according to claim 1, wherein in the attached state, the first outer opening is positioned closer to the outer surface of the housing than the first inner opening is in a direction perpendicular to the outer surface of the housing.

4. The ventilation component according to claim 1, wherein in the attached state, the second outer opening is positioned closer to the outer surface of the housing than the second inner opening is in the direction perpendicular to the outer surface of the housing.

5. The ventilation component according to claim 1, wherein in the attached state, at least one of the first outer opening and the second outer opening faces the outer surface of the housing.

6. The ventilation component according to claim 1, further comprising a seal member that seals a gap between the structural member and the outer surface of the housing in the attached state, wherein
the structural member has an engagement portion to be inserted into the ventilation opening of the housing.

7. The ventilation component according to claim 1, wherein
the structural member has a seating face with which the ventilation valve is in contact in a state where the ventilation valve is closed and with which the ventilation valve is out of contact in a state where the ventilation valve is opened, and
at least one of conditions (i) and (ii) is satisfied:
(i) the first inner opening or the second inner opening is present on a plane including the seating face,
(ii) a plane including the first inner opening or the second inner opening intersects the plane including the seating face.

8. The ventilation component according to claim 7, wherein the structural member has a flat surface that includes the seating face and that extends flat to the first inner opening or the second inner opening.

9. The ventilation component according to claim 7, wherein in the attached state, the structural member has no ventilation path that allows the inner space to communicate with the external space, in a portion that is more distant from the outer surface than the seating face is in the direction perpendicular to the outer surface.

* * * * *